(12) United States Patent
Cai

(10) Patent No.: US 11,710,749 B2
(45) Date of Patent: Jul. 25, 2023

(54) DISPLAY PANEL, MANUFACTURING METHOD THEREOF AND DISPLAY DEVICE

(71) Applicant: Wuhan Tianma Micro-Electronics Co., Ltd., Wuhan (CN)

(72) Inventor: Yu Cai, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 110 days.

(21) Appl. No.: 16/905,216

(22) Filed: Jun. 18, 2020

(65) Prior Publication Data

US 2021/0202539 A1    Jul. 1, 2021

(30) Foreign Application Priority Data

Dec. 30, 2019  (CN) .......................... 201911397181.5

(51) Int. Cl.
*H01L 27/12* (2006.01)

(52) U.S. Cl.
CPC ........ *H01L 27/1251* (2013.01); *H01L 27/124* (2013.01); *H01L 27/1222* (2013.01); *H01L 27/1259* (2013.01)

(58) Field of Classification Search
CPC ............. H01L 27/1251; H01L 27/1222; H01L 27/3262; H10K 59/1213
See application file for complete search history.

(56) References Cited

FOREIGN PATENT DOCUMENTS

| CN | 1554123 | A |   | 12/2004 |             |
|----|---------|---|---|---------|-------------|
| CN | 102983155 | A |   | 3/2013  |             |
| CN | 207264695 | U |   | 4/2018  |             |
| CN | 110061014 | A |   | 7/2019  |             |
| CN | 209070895 | U |   | 7/2019  |             |
| CN | 110189706 | A | * | 8/2019  | ......... H01L 27/3234 |
| CN | 110189706 | A |   | 8/2019  |             |

OTHER PUBLICATIONS

CN Office Action related to CN Application No. 201911397181.5 dated Apr. 30, 2021.

* cited by examiner

*Primary Examiner* — Peter M Albrecht
(74) *Attorney, Agent, or Firm* — von Briesen & Roper, s.c.

(57) ABSTRACT

Provided are a display panel, a manufacturing method thereof, and a display device. A first display region of the display panel includes first pixel units and first drive circuits, a second display region includes second pixel units and second drive circuits, wherein a pixel unit density of the first pixel units is less than a pixel unit density of the second pixel units, a number of first additional transistors in the first drive circuit is less than a number of second additional transistors in the second drive circuit, and an area of the orthographic projection of a channel area of the first drive transistor on the base substrate is less than an area of the orthographic projection of a channel area of the second drive transistor on the base substrate.

20 Claims, 11 Drawing Sheets

DISPLAY PANEL, MANUFACTURING METHOD THEREOF AND DISPLAY DEVICE

CROSS-REFERENCES TO RELATED APPLICATIONS

This application claims priority to Chinese patent application No. 201911397181.5 filed at the CNIPA on Dec. 30, 2019, the disclosure of which is incorporated herein by reference in its entirety.

TECHNICAL FIELD

Embodiments of the present disclosure relate to the field of display technologies and, in particular, to a display panel, a manufacturing method thereof and a display device.

BACKGROUND

A display panel is an important component of an electronic apparatus for implementing the display function. In existing display panels, in order to meet the requirements of integrating optical and electronic components into electronic equipment, different areas of the screen have different requirements for transparency. Achieving different transparencies in different areas to ensure the full-screen display of the display panel has become an urgent problem.

SUMMARY

In view of the above, embodiments of the present disclosure provide a display panel, a manufacturing method thereof and a display device.

In a first aspect, an embodiment of the present disclosure provides a display panel, including a base substrate, drive circuits and pixel units disposed on one side of the base substrate, wherein the display panel includes a first display region and a second display region.

The first display region includes multiple first pixel units, the second display region includes multiple second pixel units, a pixel unit density of the first pixel units is less than a pixel unit density of the second pixel units.

The first display region further includes multiple first drive circuits, and the first drive circuit is electrically connected to the first pixel unit, the second display region further includes multiple second drive circuits, and the second drive circuit is electrically connected to the second pixel unit;

the first drive circuit includes a first drive transistor and at least one first additional transistor, the second drive circuit includes a second drive transistor and a second additional transistor, a number of first additional transistors in the first drive circuit is less than a number of second additional transistors in the second drive circuit, and an area of the orthographic projection of a channel area of the first drive transistor on the base substrate is less than an area of the orthographic projection of a channel area of the second drive transistor on the base substrate.

In a second aspect, an embodiment of the present disclosure also provides a manufacturing method of the display panel. The display panel includes a first display region and a second display region;

the manufacturing method further includes:

providing a base substrate, and preparing pixel units and drive circuits disposed on one side of the base substrate; specifically, preparing a first drive circuit in the first display region, and preparing a second drive circuit in the second display region, the first drive circuit including a first drive transistor and at least one first additional transistor, the second drive circuit including a second drive transistor and at least one second additional transistor, a number of first additional transistors in the first drive circuit being smaller than a number of second additional transistors in the second drive circuit, and an area of the orthographic projection of a channel area of the first drive transistor on the base substrate being smaller than an area of the orthographic projection of a channel area of the second drive transistor on the base substrate; and preparing multiple first pixel units in the first display region, preparing multiple second pixel units in the second display region, the first pixel unit being electrically connected to the first drive circuit, the second pixel unit being electrically connected to the second drive circuit, and the pixel unit density of the first pixel units being smaller than the pixel unit density of the second pixel units.

In a third aspect, an embodiment of the present disclosure further provides a display device including a display panel described in the first aspect. The display panel includes a base substrate, drive circuits and pixel units disposed on one side of the base substrate, a first display region and a second display region. The first display region includes multiple first pixel units, the second display region includes multiple second pixel units, and a pixel unit density of the first pixel units is less than a pixel unit density of the second pixel units.

The first display region further includes multiple first drive circuits, and the first drive circuit is electrically connected to the first pixel unit, the second display region further includes multiple second drive circuits, and the second drive circuit is electrically connected to the second pixel unit. The first drive circuit includes a first drive transistor and at least one first additional transistor, the second drive circuit includes a second drive transistor and a second additional transistor, a number of first additional transistors in the first drive circuit is less than a number of second additional transistors in the second drive circuit, and an area of the orthographic projection of a channel area of the first drive transistor on the base substrate is less than an area of the orthographic projection of a channel area of the second drive transistor on the base substrate.

BRIEF DESCRIPTION OF DRAWINGS

Other features, objects and advantages of the present disclosure will become more apparent from a detailed description of non-restrictive embodiments with reference to the drawings.

DETAILED DESCRIPTION

In order to make the objects, technical solutions and advantages of the present disclosure more clear, the technical solutions of the present disclosure will be described below in detail in conjunction with the drawings of the embodiments of the present disclosure and the specific embodiments. The described embodiments are part, not all, of the embodiments of the present disclosure, and based on the embodiments of the present disclosure, other embodiments obtained by those skilled in the art on the premise that no creative work is done are within the scope of the present disclosure.

Figure 1:
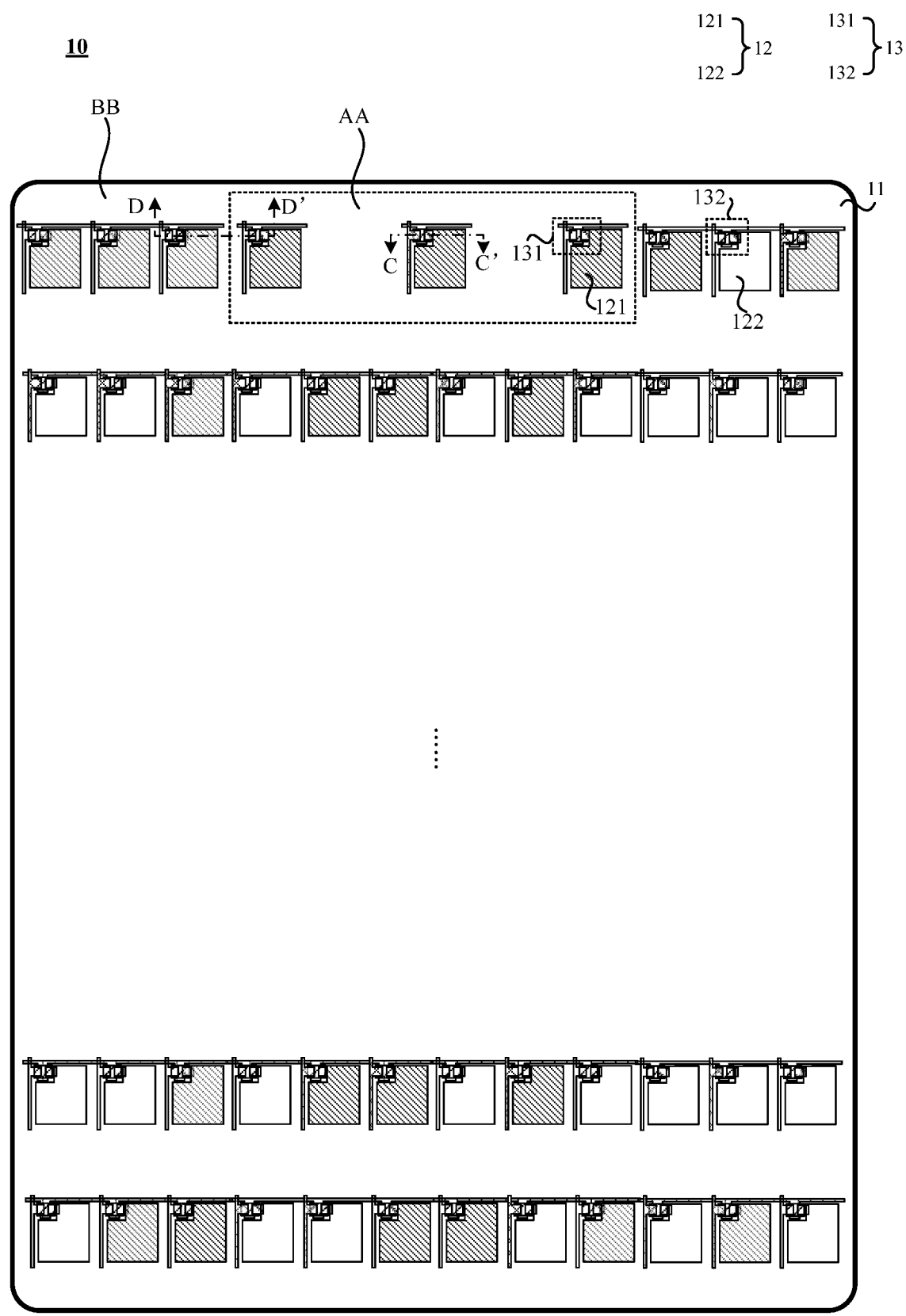
FIG. 1 is a structural diagram of a display panel according to an embodiment of the present disclosure.
Figure 2:
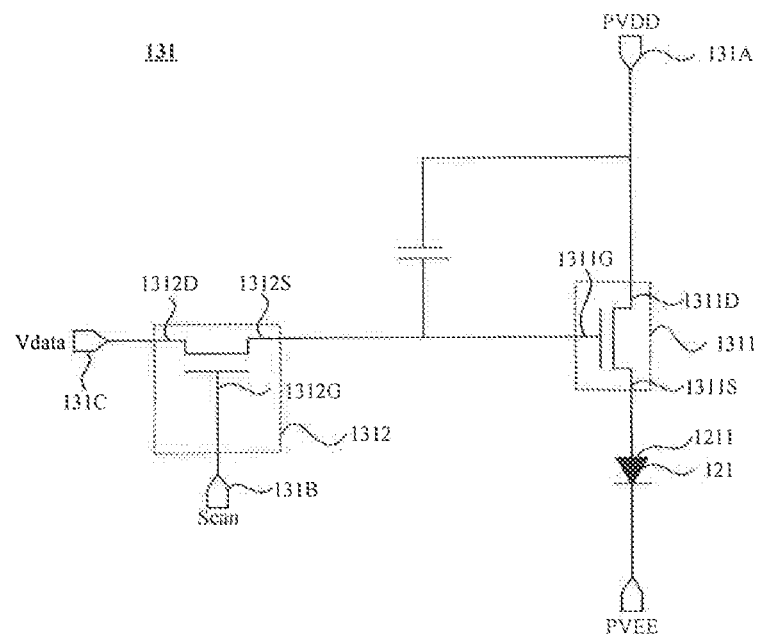
FIG. 2 is a schematic diagram illustrating a first drive circuit provided by an embodiment of the present disclosure.
Figure 3:
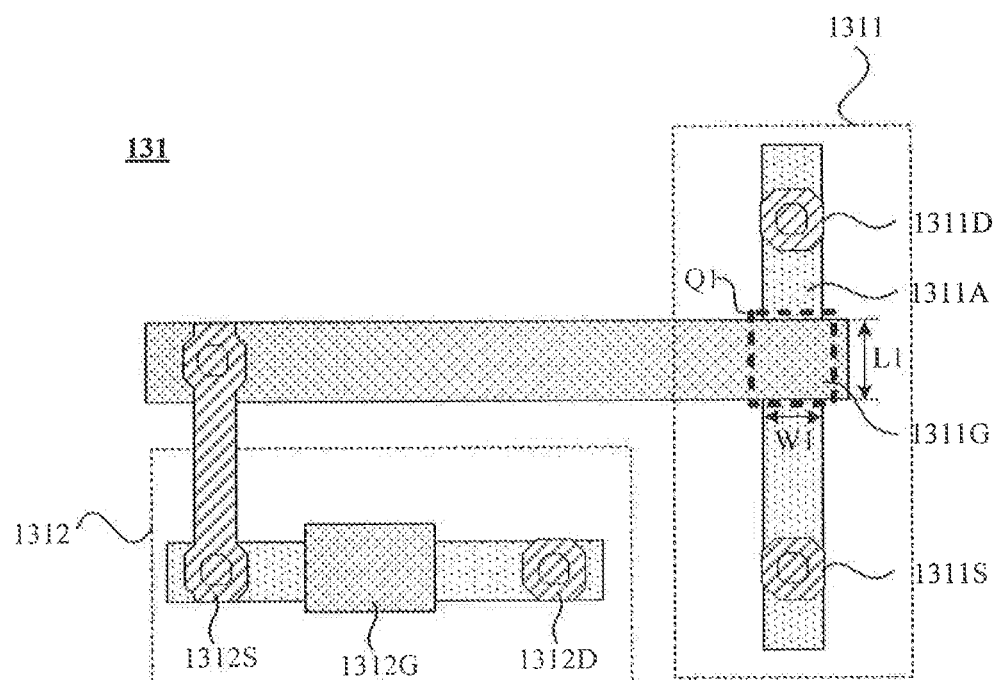
FIG. 3 is a structural diagram of a first drive circuit provided by an embodiment of the present disclosure.
Figure 4:
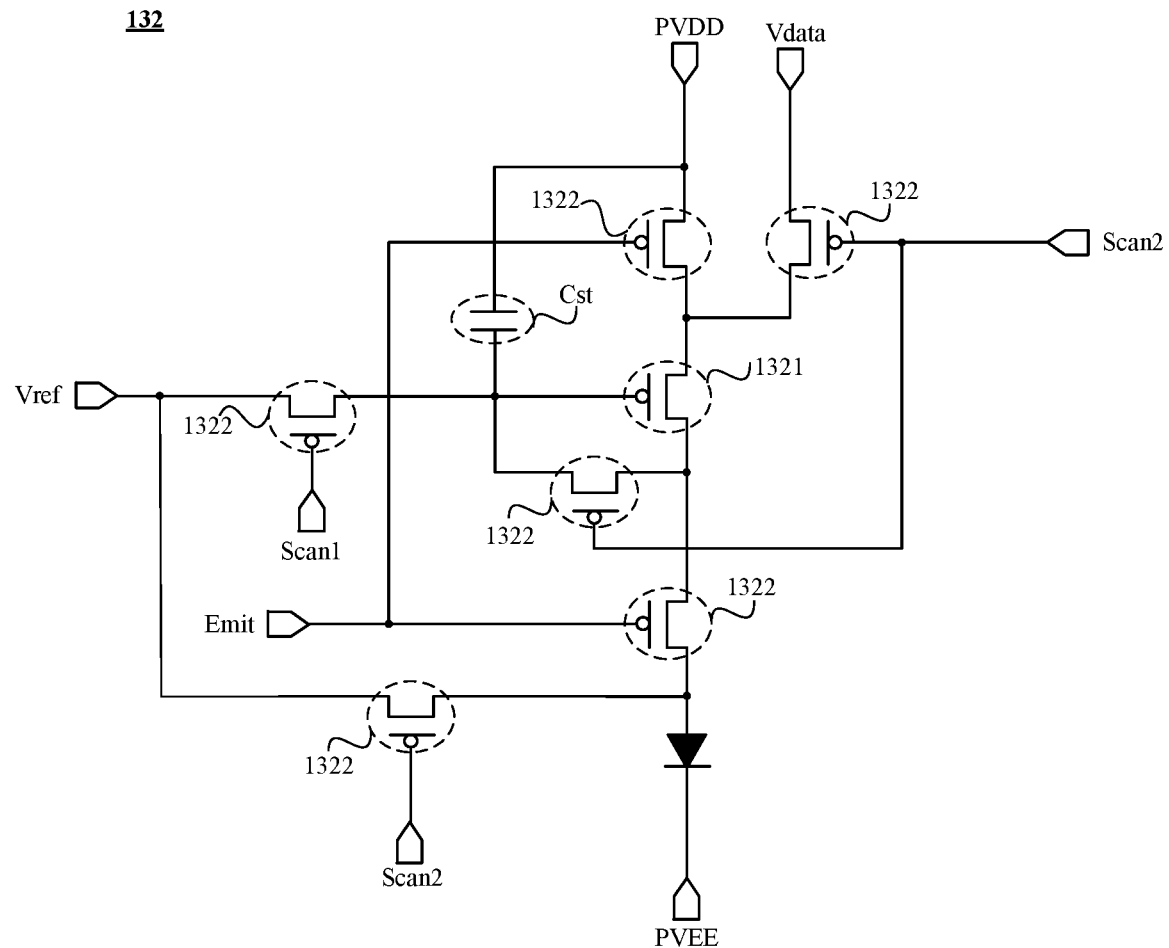
FIG. 4 is a schematic diagram illustrating a second drive circuit provided by an embodiment of the present disclosure.
Figure 5:
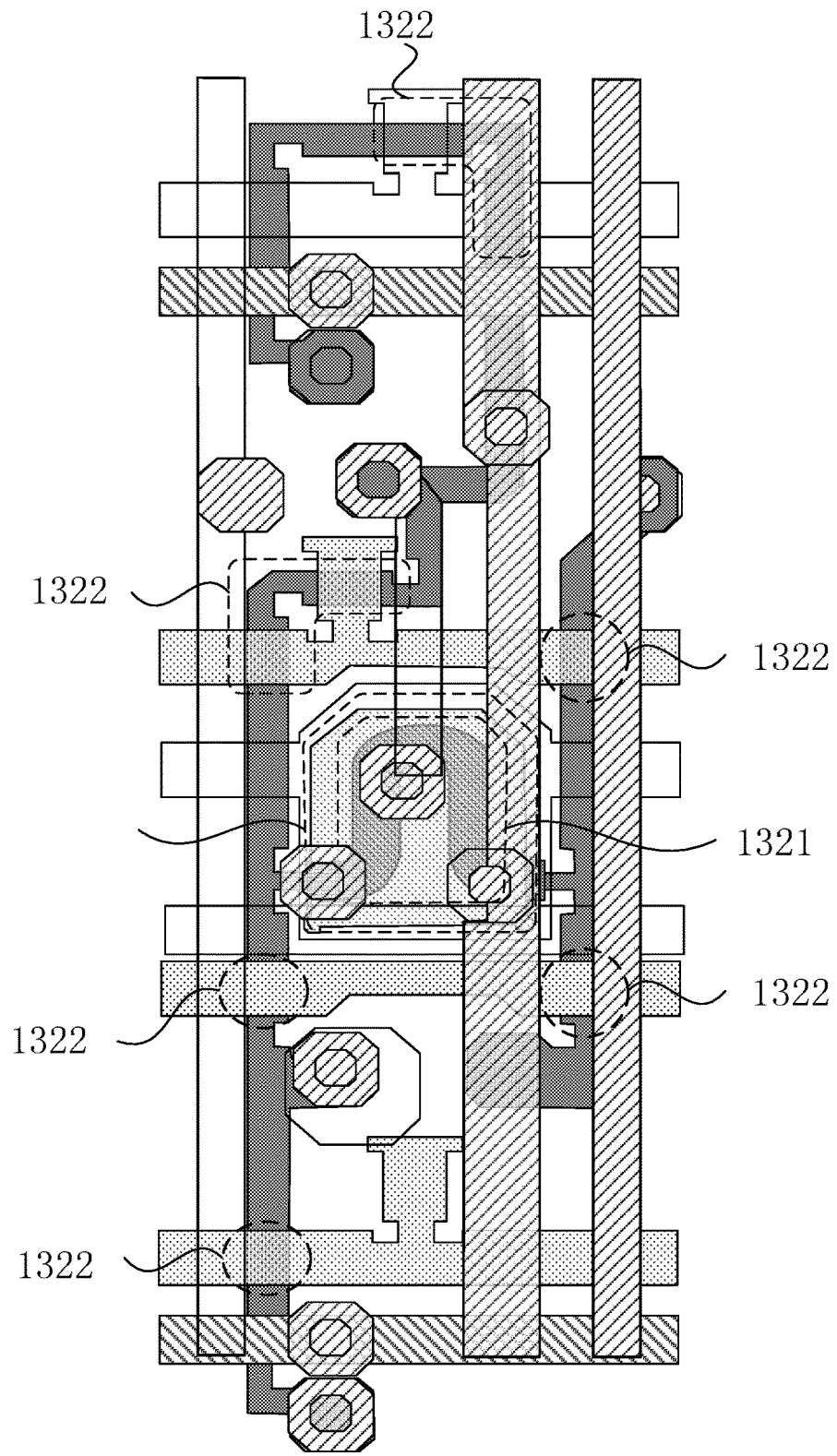
FIG. 5 is a structural diagram of a second drive circuit provided by an embodiment of the present disclosure.
Figure 6:
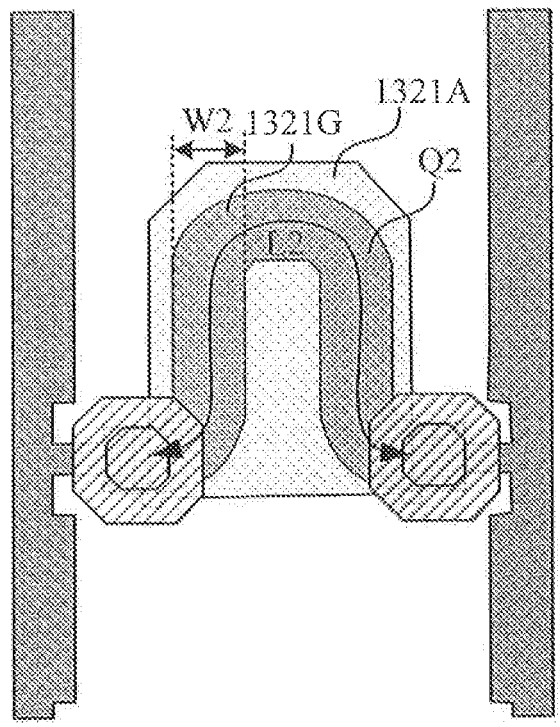
FIG. 6 is a structural diagram of a second drive transistor in a second drive circuit shown in FIG. 5.

FIG. 1 is a structural diagram of a display panel according to an embodiment of the present disclosure. FIG. 2 is a schematic diagram illustrating a first drive circuit provided by an embodiment of the present disclosure. FIG. 3 is a structural diagram of a first drive circuit provided by an embodiment of the present disclosure. FIG. 4 is a schematic diagram illustrating a second drive circuit provided by an embodiment of the present disclosure. FIG. 5 is a structural diagram of a second drive circuit provided by an embodiment of the present disclosure. FIG. 6 is a structural diagram of a second drive transistor in a second drive circuit shown in FIG. 5. FIGS. 2 and 3 illustrate an example where the first drive circuit is a 2T1C circuit, and FIGS. 4 and 5 illustrate an example where the second drive circuit is a 7T1C circuit. Referring to FIGS. 1 to 6, an embodiment of the present disclosure provides a display panel 10, including a base substrate 11, pixel units 12 and drive circuits 13 disposed on one side of the base substrate 11, wherein the display panel 10 includes a first display region AA and a second display region BB. The first display region AA includes multiple first pixel units 121, the second display region BB includes multiple second pixel units 122, and a pixel unit density of the first pixel units 121 is less than a pixel unit density of the second pixel units 122. The first display region AA further includes multiple first drive circuits 131, and the first drive circuit 131 is electrically connected to the first pixel unit 121. The second display region BB further includes multiple second drive circuits 132, and the second drive circuit 132 is electrically connected to the second pixel unit 122. The first drive circuit 131 includes a first drive transistor 1311 and at least one first additional transistor 1312, the second drive circuit 132 includes a second drive transistor 1321 and a second additional transistor 1322, a number of first additional transistors 1312 in the first drive circuit 131 is less than a number of second additional transistors 1322 in the second drive circuit 132, and an area of the orthographic projection of a channel area Q1 of the first drive transistor 1311 on the base substrate 11 is smaller than an area of the orthographic projection of a channel area Q2 of the second drive transistor 1321 on the base substrate 11.

As shown in FIG. 1, the display panel 10 includes a first display region AA and a second display region BB, wherein the first display region AA is configured with the first pixel units 121 and the first drive circuit 131, and the second display region BB is configured with the second pixel units 122 and the second drive circuit 132. Further, the first drive circuit 131 includes a first drive transistor 1311 and a first additional transistor 1312, the second drive circuit 132 includes a second drive transistor 1321 and a second additional transistor 1322, and the pixel unit density of the first pixel units 121 is configured to be less than the pixel unit density of the second pixel units 122. Meanwhile, the number of first additional transistors 1312 in the first drive circuit is configured to be less than the number of second additional transistors 1322 in the second drive circuit, ensuring the first display region AA to have a large transparent area and a high light transmittance. Further, the orthographic projection of the channel area Q1 of the first drive transistor 1311 on the base substrate 11 is configured to be smaller than the orthographic projection of the channel area Q2 of the second drive transistor 1321 on the base substrate, ensuring that an area of the first drive transistor 1311 is less than an area of the second drive transistor 1321, further reducing an area of a first drive circuit 131 and enlarging a transparent area of the first display region AA. When the first display region AA is multiplexed as a sensor configuration area, it may ensure that the sensor (such as a camera) may receive more light signals and have a good working accuracy. Further, by configuring the number of the first additional transistors 1312 to be less than the number of the second additional transistors 1322, the number of signal lines in the first display region AA may be reduced, and the scattering phenomenon of the signal lines to the light may be reduced. Meanwhile, a distance between two adjacent signal lines may be appropriately increased to reduce diffraction of light from the signal lines. Taking a camera for the sensor as an example, imaging clarity of the camera may be improved to avoid ghost images.

In view of the above, the embodiment of the present disclosure provides a display panel, configured such that the pixel unit density of the first pixel units is less than the pixel unit density of the second pixel units, and that the number of first additional transistors in the first drive circuit is smaller than the number of second additional transistors in the second drive circuit, so that the first display region is ensured to have a large transparent area and a high light transmittance. Further, by configuring the orthographic projection of the channel area of the first drive transistor on the base substrate to be smaller than the orthographic projection of the channel area of the second drive transistor on the base substrate, the area of the first drive circuit is further reduced and the transparent area of the first display region is improved. When a sensor is configured in the first display region, the sensor may receive a large light signal to ensure that the sensor may be normally used.

It is to be noted that the first drive circuit provided by the embodiment of the present disclosure may be a 2T1C circuit shown in FIGS. 2 and 3, i.e., including the first drive transistor, one first additional transistor and one capacitor structure; the first drive circuit may also be a 3T1C circuit, i.e., including the first drive transistor, two first additional transistors and one capacitor structure; the first drive circuit may also be a 4T1C circuit, i.e., including the first drive transistor, three first additional transistors and one capacitor structure. The embodiment of the present disclosure does not limit the specific structure of the first drive circuit and illustrates by taking an example that the first drive circuit is the 2T1C circuit. Meanwhile, the second drive circuit may be a 7T1C circuit shown in FIGS. 4 and 5, i.e., including the second drive transistor, six second additional transistors and one capacitor structure; the second drive circuit may also be a 6T2C circuit, i.e., including the second drive transistor, five second additional transistors and two capacitor structures; the second drive circuit may also be a 5T1C circuit, i.e., including the second drive transistor, four second additional transistors and one capacitor structure. The embodiment of the present disclosure does not limit the specific structure of the second drive circuit and illustrates by taking an example that the second drive circuit is the 7T1C circuit. The embodiment of the present disclosure only needs to ensure that the number of first additional transistors in the first drive circuit is less than the number of second additional transistors in the second drive circuit, so that the first drive circuit is ensured to have a simple structure and more space may be reserved in the first display region for a transparent area, and that the orthographic projection of the channel area of the first drive transistor on the base substrate is smaller than the orthographic projection of the channel area of the second drive transistor on the base substrate, further reducing the area of the first drive circuit 131 and improving the transparent area of the first display region AA.

It is also noted that each transistor in the embodiment of the present disclosure may be a P-type transistor or an N-type transistor, which is not limited in the embodiment of the present disclosure.

Optionally, on the basis of the above embodiment, still referring to FIGS. 3 and 6, the first drive transistor 1311 includes a first active layer 1311A and a first gate 1311G, and an overlapping area between the first active layer 1311A and the first gate 1311G is the channel area Q1 of the first drive transistor 1311; the second drive transistor 1321 includes a second active layer 1321A and the second gate 1321G, and an overlapping area between the second active layer 1321A and the second gate 1321G is the channel area Q2 of the second drive transistor 1321. A width of the channel area Q1 of the first drive transistor 1311 is W1 in a direction perpendicular to an extension direction of the first drive transistor 1311 active layer 1311A, and a width of the channel area Q2 of the second drive transistor 1321 is W2 in a direction perpendicular to an extension direction of the second drive transistor 1321 active layer 1321A. A length of the channel area Q1 of the first drive transistor 1311 is L1, and a length of the channel area Q2 of the second drive transistor 1321 is L2, where $$\frac{1}{60} < \frac{W1 \cdot L1}{W2 \cdot L2} < \frac{1}{2}.$$

In the embodiment of the present disclosure, the orthographic projection of the channel area Q1 of the first drive transistor 1311 on the base substrate 11 is smaller than the orthographic projection of the channel area Q2 of the second drive transistor 1321 on the base substrate 11, which may be implemented by configuring the width of the channel area Q1 of the first drive transistor 1311 to be the same as the width of the channel area Q2 of the second drive transistor 1321, and the length of the channel area Q1 of the first drive transistor 1311 to be less than that of the channel area Q2 of the second drive transistor 1321. Through configuring the length of the channel area Q1 of the first drive transistor 1311 to be less than the length of the channel area Q2 of the second drive transistor 1321, it is ensured that a light transmitting area of the first display region may be improved. When the first display region is used as a sensor configuration region, a sensor (such as a camera) configured in the first display region may receive more light signals to ensure that the sensor has good working accuracy.

Further, the width W1 and the length L1 of the channel area Q1 of the first drive transistor 1311 and width W2 and the length L2 of the channel area Q2 of the second drive transistor 1321 are properly configured to satisfy $$\frac{1}{60} < \frac{W1 \cdot L1}{W2 \cdot L2} < \frac{1}{2}.$$

Based on the above embodiment, multiple different implementation modes are provided for configuring the orthographic projection of the channel area Q1 of the first drive transistor 1311 on the base substrate 11 to be smaller than the orthographic projection of the channel area Q2 of the second drive transistor 1321 on the base substrate 11. Different cases are illustrated in detail as follows.

First, an example in which the first display region AA includes at least a monocrystalline silicon transistor, and the second display region BB includes a polycrystalline silicon transistor is taken for illustration.

The first display region AA includes at least the monocrystalline silicon transistor, and the second display region BB includes the polycrystalline silicon transistor. For example, the first drive transistor 1311 is the monocrystalline silicon transistor, and the second drive transistor 1321 is the polycrystalline silicon transistor. Since the monocrystalline silicon transistor has good uniformity and does not cause a threshold drift problem, there is no need to configure additional transistors to compensate a threshold of the first drive transistor 1311. Therefore, when the first drive transistor 1311 is the monocrystalline silicon transistor, only one first additional transistor 1312 may be configured as a switch transistor, and no other additional transistor is required as the threshold to compensate the transistor, so that the first drive circuit 131 has a simple structure and the first display region AA has good display uniformity. Because the polycrystalline silicon material is common, the polycrystalline silicon transistor preparation process is simple, well-understood, and low cost. The second display region BB includes the polycrystalline silicon transistor, such as a low-temperature polycrystalline silicon transistor. By properly configuring the second additional transistor, performing threshold compensation on the second drive transistor 1321 can ensure that the second drive circuit 132 has a simple preparation process and low cost, and that the second display region BB has good display uniformity.

Figure 7:
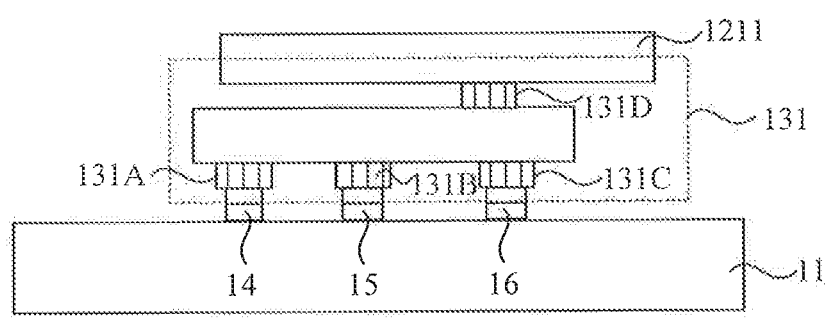
FIG. 7 is a cross-sectional view of a display panel provided by FIG. 1 taken along a section line C-C'.

Further, configuring the first display region AA to include at least the monocrystalline silicon transistor and the second display region BB to include the polycrystalline silicon transistor may also include multiple different implementation modes, which will be described in detail below. First, an example in which the first drive transistor and the first additional transistor are monocrystalline silicon transistors, and the first drive transistor and the first additional transistor are connected to other film layers of the display panel in a manner of transfer is taken for illustration. That is, the first drive transistor and the first additional transistor may be transferred to one side of the base substrate after being prepared on the monocrystalline silicon. FIG. 7 is a cross-sectional view of a display panel provided by FIG. 1 taken along a section line C-C'. Referring to FIGS. 2, 3 and 7, the first drive circuit 131 includes the first drive transistor 1311 and one first additional transistor 1312; the first drive transistor 1311 and the first additional transistor 1312 include the monocrystalline silicon transistor; the first drive transistor 1311 includes a first input electrode 1311D, a first output electrode 1311S and a first control electrode 1311G; the first additional transistor 1312 includes a second input electrode 1312D, a second output electrode 1312S, and a second control electrode 1312G, where the second output electrode 1312S is electrically connected to the first control electrode 1311G; the drive circuit 131 further includes a voltage signal receiving terminal 131A, a scanning signal receiving terminal 131B, a data signal receiving terminal 131C, and an anode connection terminal 131D. The voltage signal receiving terminal 131A is electrically connected to the first input electrode 1311D, the scanning signal receiving terminal 131B is electrically connected to the second control electrode 1312G, the data signal receiving terminal 131C is electrically connected to the second input electrode 1312D, and the anode connection terminal 131D is electrically connected to the first output electrode 1311S (not shown in the figure). The display panel 10 further includes a voltage signal line (not shown in the figure), a scanning signal line (not shown in the figure), a data signal line (not shown in the figure) and an anode 1211 disposed on one side of the base substrate 11, and a voltage signal output terminal 14, a scanning signal output terminal 15 and a data signal output terminal 16 disposed on one side of the base substrate 11 and in the first display region AA. The voltage signal output terminal 14 is electrically connected to the voltage signal line and the voltage signal receiving terminal 131A separately, the scanning signal output terminal 15 is electrically connected to the scanning signal line and the scanning signal receiving terminal 131B separately, the data signal output terminal 16 is electrically connected to the data signal line and the data signal receiving terminal 131C separately, and the anode 1211 is electrically connected to the anode connection terminal 131D.

Exemplarily, when the first drive transistor 1311 and the first additional transistor 1312 are monocrystalline silicon transistors, the first drive transistor 1311 and the first additional transistor 1312 may be transferred to the side of the base substrate 11 after being prepared on the monocrystalline silicon. As shown in FIG. 3, inside the first drive circuit 131, the second output electrode 1312S is electrically connected to the first control electrode 1311G. As shown in FIGS. 2 and 7, the voltage signal receiving terminal 131A, the scanning signal receiving terminal 131B, the data signal receiving terminal 131C and the anode connection terminal 131D are configured on a surface of the first drive circuit 131. Meanwhile, the voltage signal receiving terminal 131A is electrically connected to the first input electrode 1311D, the scanning signal receiving terminal 131B is electrically connected to the second control electrode 1312G, the data signal receiving terminal 131C is electrically connected to the second input electrode 1312D, and the anode connection terminal 131D is electrically connected to the first output electrode 1311S. Correspondingly, to ensure the normal operation of the first drive circuit 131, the display panel 10 further includes the voltage signal output terminal 14, the scanning signal output terminal 15 and the data signal output terminal 16 configured in the first display region AA and disposed on one side of the substrate 11; the voltage signal output terminal 14 transmits a voltage signal transmitted by the voltage signal line to the voltage signal receiving terminal 131A, the scanning signal output terminal 15 transmits a scanning signal transmitted by the scanning signal line to the scanning signal receiving terminal 131B, and the data signal output terminal 16 transmits a data signal transmitted by the data signal line to the data signal receiving terminal 131C; and the anode 1211 is electrically connected to the anode connection terminal 131D, which ensures that the first drive circuit 131 may normally receive various signals and normally drive the first pixel unit 121 to emit light.

Further, as shown in FIG. 7, the voltage signal output terminal 14, the scanning signal output terminal 15 and the data signal output terminal 16 are disposed on a same layer and disposed on one side of the first drive circuit 131 facing away from the anode 1211, and the first drive circuit 131 is disposed on a plane between the anode 1211 and the voltage signal output terminal 14. Exemplarily, as shown in FIG. 7, the voltage signal receiving terminal 131A, the scanning signal receiving terminal 131B, and the data signal receiving terminal 131C are disposed in the same layer and disposed on one side of the first drive circuit 131, the anode connection terminal 131D is disposed on another side of the first drive circuit 131, and the voltage signal output terminal 14, the scanning signal output terminal 15, and the data signal output terminal 16 are disposed in the same layer and are disposed on one side of the first drive circuit 131 facing away from the anode 1211. The first drive circuit 131 is disposed between the anode 1211 and the voltage signal output terminal 14, which ensures that the voltage signal receiving terminal 131A is aligned with the voltage signal output terminal 14 in an orientation facing the voltage signal output terminal 14, that the scanning signal receiving terminal 131B is aligned with the scanning signal output terminal 15 in an orientation facing the scanning signal output terminal 15, that the data signal receiving terminal 131C is aligned with the data signal output terminal 16 in an orientation facing the data signal output terminal 16, and that the anode connection terminal 131D is connected to the anode 1211 in an orientation facing away from the base substrate 11, which ensures that the alignment relationship between the first drive circuit 131 and the display panel 10 is simple, and that the structures of the display panel 10 and the first drive circuit 131 are simple.

First, an example in which the first drive transistor is the monocrystalline silicon transistor, the first additional transistor is polycrystalline silicon thin film transistor, and the first drive transistor is electrically connected to other film layers of the display panel in a manner of transfer is used to illustrate the structure of the display panel.

Figure 8:
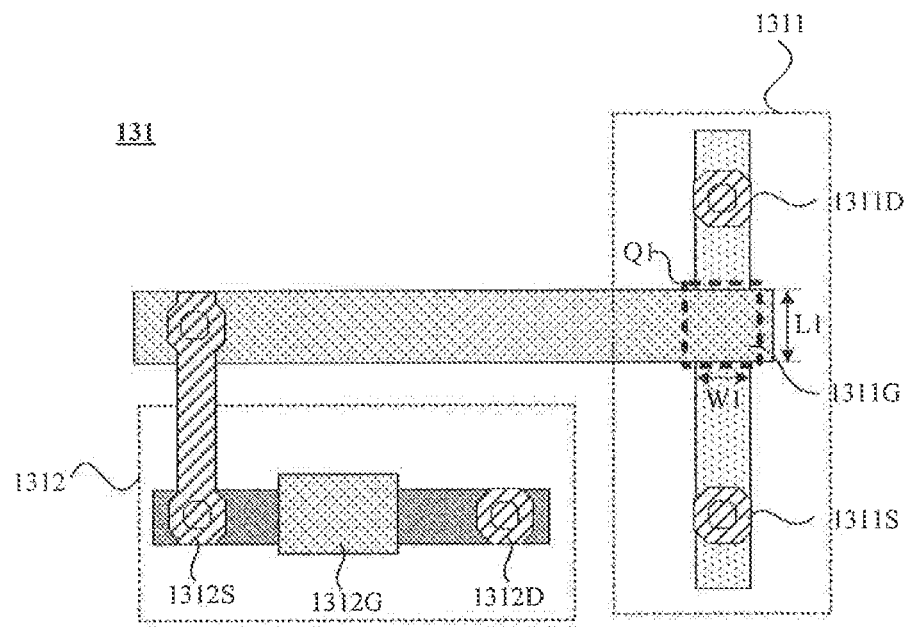
FIG. 8 is a structural diagram of another first drive circuit provided by an embodiment of the present disclosure.
Figure 9:
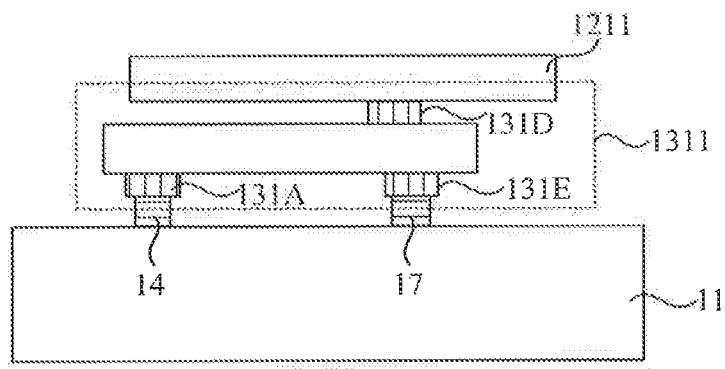
FIG. 9 is another cross-sectional view of a display panel provided by FIG. 1 taken along a section line C-C'.

FIG. 8 is a structural diagram of another first drive circuit provided by an embodiment of the present disclosure. FIG. 9 is another cross-sectional view of a display panel provided by FIG. 1 taken along a section line C-C'. As shown in FIGS. 2, 8 and 9, the first drive circuit 131 includes the first drive transistor 1311 and one first additional transistor 1312. The first drive transistor 1311 includes the monocrystalline silicon transistor, and the first additional transistor 1312 includes the polycrystalline silicon transistor. The first drive transistor 1311 includes the first input electrode 1311D, the first output electrode 1311S, the first control electrode 1311G, the voltage signal receiving terminal 131A, the control signal receiving terminal 131E, and the anode connection terminal 131D. The voltage signal receiving terminal 131A is electrically connected to the first input electrode 1311D, the control signal receiving terminal 131E is electrically connected to the first control electrode 1311G (not shown in the figure), and the anode connection terminal 131D is electrically connected to the first output electrode 1311S. The display panel 10 further includes the voltage signal line (not shown in the figure), the scanning signal line (not shown in the figure), the data signal line (not shown in the figure), and the anode 1211 disposed on one side of the base substrate 11; the first additional transistor 1312, the voltage signal output terminal 14 and the control signal output terminal 17 are disposed on one side of the base substrate 11 and located in the first display region AA; the first additional transistor 1312 includes the second input electrode 1312D, the second output electrode 1312S and the second control electrode 1312G; and the voltage signal output terminal 14 is electrically connected to the voltage signal line and the voltage signal receiving terminal 131A separately, the control signal output terminal 17 is electrically connected to the second output electrode 1312S and the control signal receiving terminal 131E separately, the scanning signal line is electrically connected to the second control electrode 1312G, the data signal line is electrically connected to the second input electrode 1312D, and the anode 1211 is electrically connected to the anode connection terminal 131D.

Exemplarily, when the first drive transistor 1311 is the monocrystalline silicon transistor, and the first additional transistor 1312 is the polycrystalline silicon transistor, the first drive transistor 1311 may be transferred to a side of the base substrate 11 after being prepared on the monocrystalline silicon, and the first additional transistor 1312 may be directly prepared and disposed on one side of the base substrate 11. Further, to ensure that the first drive transistor 1311 normally receives signals, a surface of the first drive transistor 1311 may be provided with the voltage signal receiving terminal 131A, the control signal receiving terminal 131E, and the anode connection terminal 131D, wherein the voltage signal receiving terminal 131A is electrically connected to the first input electrode 1311D, the control signal receiving terminal 131E is electrically connected to the first control electrode 1311G (not shown in the figure), and the anode connection terminal 131D is electrically connected to the first output electrode 1311S. Correspondingly, to ensure the normal operation of the first driving circuit 131, the display panel 10 further includes the voltage signal line (not shown in the figure), the scanning signal line (not shown in the figure), the data signal line (not shown in the figure), and the anode 1211 configured in the first display region AA and disposed on one side of the base substrate 11, and the voltage signal output terminal 14 and the control signal output terminal 17 located in the first display region AA, wherein the voltage signal output terminal 14 is electrically connected to the voltage signal line and the voltage signal receiving terminal 131A separately, the control signal output terminal 17 is electrically connected to the second output electrode 1312S and the control signal receiving terminal 131E, the scanning signal line is electrically connected to the second control electrode 1312G, the data signal line is electrically connected to the second input electrode 1312D, and the anode 1211 is electrically connected to the anode connection terminal 131D, which ensures that the first drive circuit 131 may normally drive the first pixel unit 121 to emit light and display.

Further, as shown in FIG. 9, the voltage signal output terminal 14 and the control signal output terminal 17 are disposed on a same layer and disposed on one side of the first drive transistor 1311 facing away from the anode 1211, the first drive transistor 1311 is disposed on a plane between the anode 1211 and the voltage signal output terminal 14.

Exemplarily, as shown in FIG. 9, the voltage signal receiving terminal 131A and the control signal receiving terminal 131E are disposed in the same layer and disposed on one side of the first drive transistor 1311, the anode connection terminal 131D is disposed on the other side of the first drive transistor 1311, and the voltage signal output terminal 14 and the control signal output terminal 17 are disposed in the same layer and located disposed on one side of the first drive transistor 1311 facing away from the anode 1211. The first drive transistor 1311 is disposed between the anode 1211 and the voltage signal output terminal 14 to ensure that the voltage signal receiving terminal 131A is aligned with the voltage signal output terminal 14 in an orientation facing the voltage signal output terminal 14, the control signal receiving terminal 131E is aligned with the control signal output terminal 17 in an orientation facing the control signal output terminal 17, and the anode connection terminal 131D is connected to the anode 1211 in an orientation facing away from the base substrate 11 to ensure that the alignment relationship between the first drive circuit 131 and the display panel 10 is simple, and that the structures of the first drive circuit 131 and the display panel 10 are simple.

In the above embodiment, the structure of the display panel is described in detail by illustrating an example in which at least the first drive transistor is a monocrystalline silicon transistor and is connected to other film layers in the display panel in a manner of transfer. Through preparing the signal connection terminal in a first drive transistor portion and a display panel portion, it is ensured that the first drive transistor may receive signals normally, and the display panel located in the first display region may work normally.

Next, the structure of the display panel is described by taking an example in which the first drive transistor and the first additional transistor are both monocrystalline silicon transistors, the second drive transistor and the second additional transistor are both polycrystalline silicon transistors, and the first drive transistor and the first additional transistor are prepared and disposed on one side of the base substrate.

Optionally, the first drive transistor and the first additional transistor include a monocrystalline silicon active layer, the second drive transistor and the second additional transistor include a polycrystalline silicon active layer, and the monocrystalline silicon active layer and the polycrystalline silicon active layer are configured in different layers.

Figure 10:
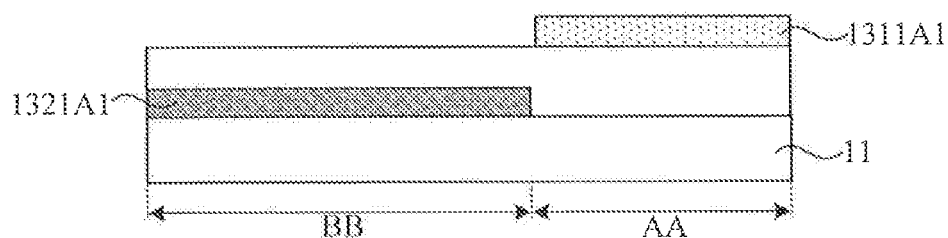
FIG. 10 is a cross-sectional view of a display panel provided by FIG. 1 taken along a section line D-D'.
Figure 11:
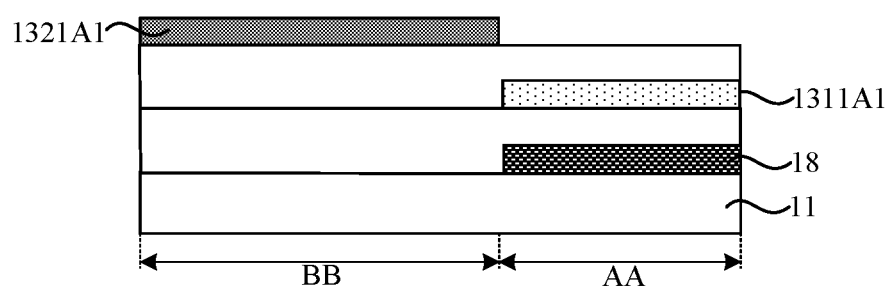
FIG. 11 is another cross-sectional view of a display panel provided by FIG. 1 taken along a section line D-D'.

Specifically, FIG. 10 is a cross-sectional view of a display panel provided by FIG. 1 taken along a section line D-D'. FIG. 11 is another cross-sectional view of a display panel provided by FIG. 1 taken along a section line D-D'. FIGS. 10 and 11 only exemplarily show an active layer of the first drive transistor 1311 and an active layer of the second drive transistor 1321. As shown in FIGS. 10 and 11, the first drive transistor 1311 includes the monocrystalline silicon active layer 1311A1, the second drive transistor 1321 includes the polycrystalline silicon active layer 1321A1, and the monocrystalline silicon active layer 1311A1 and the polycrystalline silicon active layer 1321A1 are arranged in different layers. The monocrystalline silicon active layer 1311A1 and the polycrystalline silicon active layer 1321A1 are arranged in different layers to ensure that the monocrystalline silicon active layer 1311A1 and the polycrystalline silicon active layer 1321A1 are independent of each other and do not affect each other, that the first drive circuit 131 and the second drive circuit 132 are mutually independent and do not affect each other, and that the display panel displays normally.

Further, as shown in FIG. 10, the monocrystalline silicon active layer 1311A1 is disposed on one side of the polycrystalline silicon active layer 1321A1 facing away from the base substrate 11, so that the monocrystalline silicon active layer may be prepared after the polycrystalline silicon active layer 1321A1 is formed and excimer laser annealing is performed on the polycrystalline silicon active layer 1321A1, so that the excimer laser annealing process does not affect the monocrystalline silicon active layer 1311A1, ensuring that the first drive transistor 1311 and the first additional transistor 1312 work normally.

Further, the monocrystalline silicon active layer 1311A1 is configured on one side of the polycrystalline silicon active layer 1321A1 facing towards the base substrate 11. The display panel 10 further includes a light-blocking layer 18, which is disposed between the monocrystalline silicon active layer 1311A1 and the base substrate 11, and a vertical projection of the light-blocking layer 18 on the plane of the base substrate 11 is at least partially overlapped with a vertical projection of the monocrystalline silicon active layer 1311A1 on the plane of the base substrate 11. In this case, when the excimer laser annealing is performed on the polycrystalline silicon active layer 1321A1, the monocrystalline silicon active layer 1311A1 is blocked and protected by the light-blocking layer 18, so that the excimer laser annealing process does not affect the monocrystalline silicon active layer 1311A1, ensuring that the first drive transistor 1311 and the first additional transistor 1312 work normally.

In the above embodiment, the structure of the display panel is illustrated by taking an example in which the first drive transistor and the first additional transistor are both monocrystalline silicon transistors, and the first drive transistor and the first additional transistor are directly manufactured on one side of the base substrate. The monocrystalline silicon transistor and the polycrystalline silicon transistor are directly manufactured on the side of the base substrate, so that the preparation process of the monocrystalline silicon transistor and the polycrystalline silicon transistor is simple.

In summary, configuring the first display region to include at least the monocrystalline silicon transistor may ensure that the structure of the first drive circuit is simple, the transparent area of the first display region is increased, and the display uniformity of the first display region is good. Configuring the polycrystalline silicon transistor in the second display region ensures that the preparation process of the second display region is simple and the cost is low. Through reasonably configuring the second additional transistor to compensate a threshold of the second drive transistor, the display uniformity of the second display region may also be ensured to be good.

An embodiment in which the first display region AA and the second display region BB both include the polycrystalline silicon transistor is taken as an example for illustration. The first display region AA and the second display region BB both include the polycrystalline silicon transistors. The polycrystalline silicon transistors in the first display region AA and the second display region BB may be manufactured by using the same material in the same process to ensure that the display panel has a simple film structure while ensuring that the display panel manufacturing process is simple.

Optionally, the first drive transistor and the first additional transistor may include the polycrystalline silicon transistor, and the second drive transistor and the second additional transistor may include the polycrystalline silicon transistor. The first drive transistor and the first additional transistor include a first polycrystalline silicon active layer, the second drive transistor and the second additional transistor include a second polycrystalline silicon active layer, a grain size of the first polycrystalline silicon active layer is larger than a grain size of the second polycrystalline silicon active layer, and the first polycrystalline silicon active layer and the second polycrystalline silicon active layer are disposed in the same layer.

Figure 12:
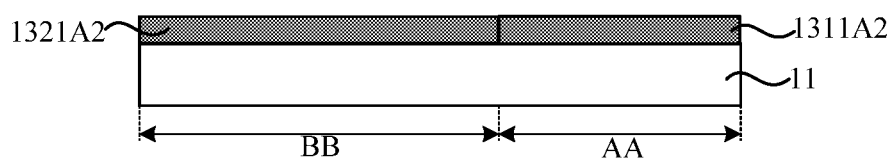
FIG. 12 is another cross-sectional view of a display panel provided by FIG. 1 taken along a section line D-D'.

Specifically, FIG. 12 is another cross-sectional view of a display panel provided by FIG. 1 taken along a section line D-D'. FIG. 12 only exemplarily illustrates the active layers of the first drive transistor 1311 and the second drive transistor 1321. As shown in FIG. 12, the first drive transistor 1311 includes the first polycrystalline silicon active layer 1311A2, and the second drive transistor includes the second polycrystalline silicon active layer 1321A2. The grain size of the first polycrystalline silicon active layer 1311A2 is larger than the grain size of the second polycrystalline silicon active layer 1321A2. Compared with the second polycrystalline silicon active layer 1321A2, the first polycrystalline silicon active layer 1311A2 has fewer grain boundaries, better uniformity, and no threshold drift problem or at least a smaller degree of threshold drift, so that it is not necessary to configure other additional transistors to compensate the threshold of the first drive transistor 1311 to ensure good display uniformity of the first display region.

Further, the first polycrystalline silicon active layer 1311A2 and the second polycrystalline silicon active layer 1321A2 are disposed in the same layer and prepared in the same process, so that the manufacturing process of the first drive circuit 131 and the second drive circuit 132 is simple, and the display panel has a simple film structure.

Further, the grain size of the first polycrystalline silicon active layer 1311A2 is D1, and the grain size of the second polycrystalline silicon active layer 1321A2 is D2, where 50 µm≤D1≤5 mm, 10 nm≤D2≤10 µm. Reasonably configuring the grain size D1 of the first polycrystalline silicon active layer 1311A2 to satisfy 50 µm≤D1≤5 mm may ensure that the first polycrystalline silicon active layer 1311A2 has fewer grain boundaries, good uniformity, and no threshold drift problem or at least a smaller degree of threshold drift; reasonably configuring the grain size D2 of the second polycrystalline silicon active layer 1321A2 to satisfy 10 nm≤D2≤10 µm may ensure that the second polycrystalline silicon active layer 1321A2 matches the existing polycrystalline silicon material and preparation process, and has a low cost and simple preparation process.

Further, an electron mobility of the first polycrystalline silicon active layer 1311A2 provided by the embodiment of the present disclosure may satisfy V≥500 cm$^2$/(volt·second), ensuring that the first polycrystalline silicon active layer 1311A2 has a large electron mobility and that the first drive transistor 1311 may provide a larger drive current, which ensures that the first pixel unit 121 emits light normally.

In summary, through configuring both the first display region and the second display region to include polycrystalline silicon transistors, and through reasonably configuring the grain size of the first polycrystalline silicon active layer and the grain size of the second polycrystalline silicon active layer, it may ensure that the first polycrystalline silicon active layer has good uniformity and no threshold drift problem or at least a smaller degree of threshold drift. Therefore, no threshold compensation circuit is needed, the structure of the first drive circuit is simple, and the transparent area of the first display region is large.

On the basis of the above embodiment, the first display region further includes a first signal line (not shown in the figure) connected to the first drive circuit, and the second display region further includes a second signal line (not shown in the figure) connected to the second drive circuit. A line width of the first signal line is d1 and a line width of the second signal line is d2 satisfies 500 nm≤d1≤2 μm, d2≥2 μm.

Specifically, the first signal line connected to the first drive circuit may be a data signal line or a voltage signal line, and the second signal line connected to the second drive circuit may be the data signal line or the voltage signal line. Since the first drive transistor in the embodiment of the present disclosure may be the monocrystalline silicon transistor or the polycrystalline silicon transistor having a relatively large grain size, the carrier mobility of the first drive transistor is higher than that of the second driving transistor, a length of the channel area of the first drive transistor is shorter than that of the channel area of the second drive transistor, and a width of the channel area of the first drive transistor is equal to that of the channel area of the second drive transistor. Therefore, the channel area of the first drive transistor has a greater aspect ratio. Because the carrier mobility and the channel aspect ratio are parameters that determine a drive current, the drive current provided by the first drive transistor is greater than the drive current provided by the second drive transistor. In the embodiment of the present disclosure, the line width of the first signal line connected to the first drive circuit is configured to be smaller than the line width of the second signal line connected to the second drive circuit. A conductive resistance of the first drive transistor is large and a loss of the current on the first signal line is large, and because the drive current provided by the first drive transistor is greater than the drive current provided by the second drive transistor, the larger drive current may make up for the loss caused by the signal line resistance, which ensures that the first light-emitting unit and the second light-emitting unit may receive the same or similar drive current and that the display brightness of the first display region and the second display region are the same or similar. Further, configuring the line width of the first signal line to be small may also increase the transparent area of the first display region, increase the luminous flux received by the sensor, and improve the usage accuracy of the sensor.

Further, the line width d1 of the first signal line is configured to satisfy 500 nm≤d1≤2 μm, the line width d2 of the second signal line is configured to satisfy d2≥2 μm, and the transparent area of the first display region is improved in satisfying the existing preparation process, which ensures that the first and second light-emitting units may receive the same or similar drive current.

Figure 13:
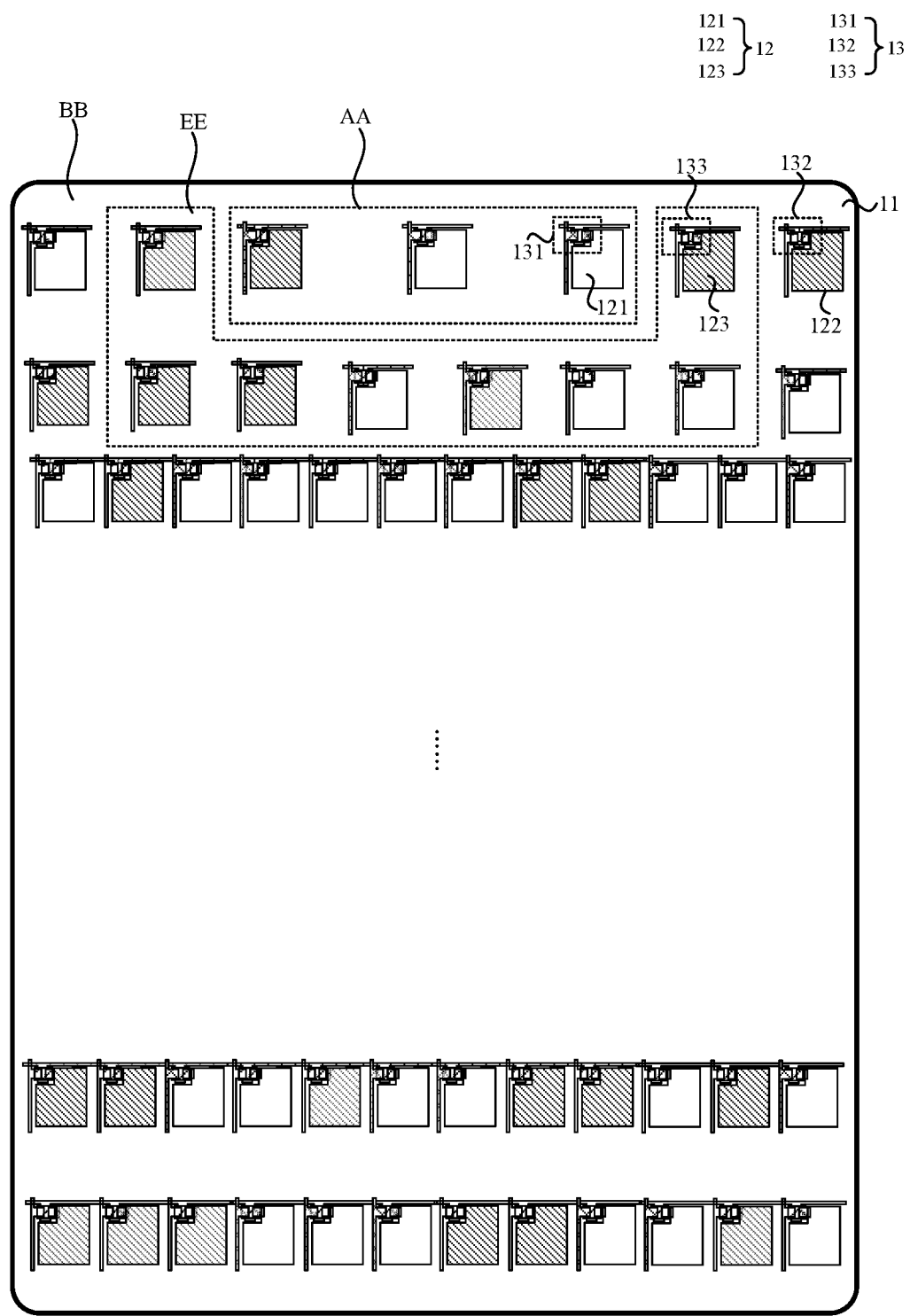
FIG. 13 is a structural diagram of another display panel provided by an embodiment of the present disclosure.

Optionally, FIG. 13 is a structural diagram of another display panel provided by an embodiment of the present disclosure. As shown in FIG. 13, the display panel provided by the embodiment of the present disclosure may further include a transition display region EE located between the first display region AA and the second display region BB. The transition display region EE includes a third pixel unit 123 and a third drive circuit 133. A pixel unit density of the pixel unit 123 is greater than the pixel unit density of the first pixel unit 121 and less than the pixel unit density of the second pixel unit 122. The third drive circuit 133 includes a third drive transistor 1331 and at least one third additional transistor 1332. The number of third additional transistors 1332 in the third drive circuit 133 is larger than the number of first additional transistors 1312 in the first drive circuit 131 and smaller than the number of second additional transistors 1322 in the second drive circuit 132; the area of the orthographic projection of the channel area of the third drive transistor 1331 on the base substrate is larger than the area of the orthographic projection of the channel area of the first drive transistor 1311 on the base substrate, and smaller than the area of the orthographic projection of the channel area of the second drive transistor 1321 on the base substrate.

Figure 14:
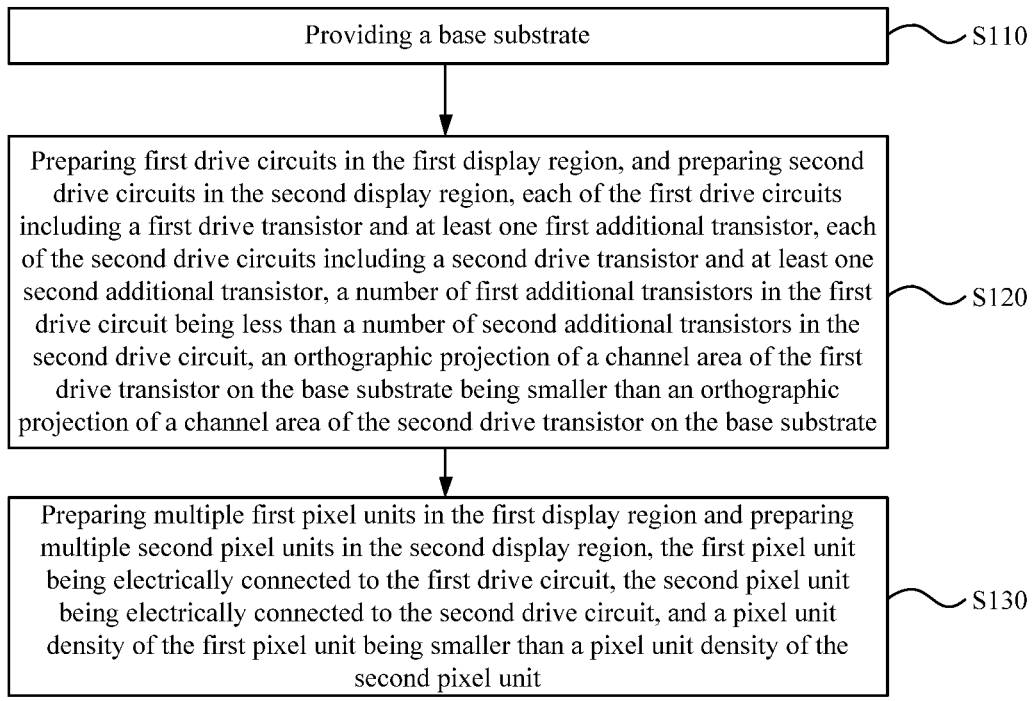
FIG. 14 is a flowchart of a manufacturing method of a display panel provided by an embodiment of the present disclosure.

Exemplarily, the transition display region EE is provided between the first display region AA and the second display region BB. Meanwhile, a pixel unit density of the transition display region 13 is configured to be greater than the pixel unit density of the first pixel unit 121 and less than the pixel unit density of the second pixel unit 122, the number of third additional transistors 1332 is greater than the number of first additional transistors 1312 and less than the number of the second additional transistors 1322. The channel area of the third drive transistor 1331 is greater than that of the first drive transistor 1311, and smaller than the channel area of the second drive transistor 1321, which ensures that, when displaying and transmitting from the second display region BB to the transition display region EE and then to the first display region AA, the transition of the whole display panel is natural between different display regions and avoids visual problems due to sudden changes in pixel unit density, the number of additional transistors, and the channel area of the drive transistors between the first display region AA and the second display region BB, which ensures that the display panel has a good display effect. Based on the same inventive concept, an embodiment of the present disclosure further provides a manufacturing method of a display panel, for manufacturing the display panel described in the above embodiment. Specifically, FIG. 14 is a flowchart of another manufacturing method of a display panel according to an embodiment of the present disclosure. As shown in FIG. 14, a manufacturing method of a display panel according to the embodiment of the present disclosure includes the steps described above.

In step S110, a base substrate is provided.

In step S120, a first drive circuit is prepared in the first display region, a second drive circuit is prepared in the second display region, the first drive circuit includes a first drive transistor and at least one first additional transistor, the second drive circuit includes a second drive transistor and at least one second additional transistor, a number of first additional transistors in the first drive circuit is less than a number of second additional transistors in the second drive circuit, and an area of the orthographic projection of a channel area of the first drive transistor on the base substrate is smaller than an area of the orthographic projection of a channel area of the second drive transistor on the base substrate.

In step S130, multiple first pixel units are prepared in the first display region, multiple second pixel units are prepared in the second display region, the first pixel unit is electrically connected to the first drive circuit, the second pixel unit is electrically connected to the second drive circuit, and the pixel unit density of the first pixel units is smaller than the pixel unit density of the second pixel units.

Exemplarily, referring to FIG. 1, the display panel includes the first display region AA and the second display region BB. The first drive circuit 131 and the first pixel unit 121 are prepared in the first display region AA, and the second drive circuit 132 and the second pixel unit 122 are prepared in the second display region BB. Through configuring the pixel unit density of the first display region AA to be smaller than the pixel unit density of the second display region BB, and the number of first additional transistors 1312 in the first drive circuit 131 to be smaller than the number of second additional transistors 1322 of the second drive circuit 132, the first display region AA is ensured to have a large transparent area and a high light transmittance. Further, through configuring the orthographic projection of the channel area of the first drive transistor 1311 on the base substrate 11 to be smaller than the orthographic projection of the channel area of the second drive transistor 1321 on the base substrate 11, the area of the first drive circuit 131 is further reduced, and the transparent area of the first display region AA is increased. When the sensor is configured in the first display region, the sensor may receive a larger light signal to ensure that the sensor may be used normally.

Optionally, preparing the first drive circuit in the first display region includes multiple different manufacturing methods, which are described below in several feasible implementation modes.

Optionally, the first drive circuit may include the first drive transistor and the first additional transistor, wherein the first drive transistor and the first additional transistor include a monocrystalline silicon transistor, and preparing the first drive circuit in the first display region may include the steps of:

multiple first drive circuits are prepared on a monocrystalline silicon wafer and a first drive circuit encapsulation structure is obtained, wherein the first drive circuit includes the first drive transistor, one first additional transistor, a voltage signal receiving terminal, a scanning signal receiving terminal, a data signal receiving terminal and an anode connection terminal; the first drive transistor includes a first input electrode, a first output electrode, and a first control electrode; the first additional transistor includes a second input electrode, a second output electrode, and a second control electrode; the second output electrode is electrically connected to the first control electrode, the voltage signal receiving terminal is electrically connected to the first input electrode, the scanning signal receiving terminal is electrically connected to the second control electrode, the data signal receiving terminal is electrically connected to the second input electrode, and the anode connection terminal is electrically connected to the first output electrode.

A voltage signal line, a scanning signal line, a data signal line, and an anode are prepared on the base substrate, and a voltage signal output terminal, a scanning signal output terminal, and a data signal output terminal in an area are prepared on the base substrate corresponding to the first display region; the voltage signal output terminal is electrically connected to the voltage signal line, the scanning signal output terminal is electrically connected to the scanning signal line, and the data signal output terminal is electrically connected to the data signal line. The first drive circuit encapsulation structure is transferred to the first display region on the base substrate, so that the voltage signal output terminal is electrically connected to the voltage signal receiving terminal, the scanning signal output terminal is electrically connected to the scanning signal receiving terminal, the data signal output terminal is electrically connected to the data signal receiving terminal, and the anode is electrically connected to the anode connection terminal.

Exemplarily, referring to FIGS. 2, 3 and 7, when the first drive transistor 1311 and the first additional transistor 1312 are monocrystalline silicon transistors, the first drive transistor 1311 and the first additional transistor 1312 may be transferred to the side of the base substrate 11 after being prepared on the monocrystalline silicon. As shown in FIG. 3, inside the first drive circuit 131, the second output electrode 1312S is electrically connected to the first control electrode 1311G. As shown in FIGS. 2 and 7, the voltage signal receiving terminal 131A, the scanning signal receiving terminal 131B, the data signal receiving terminal 131C and the anode connection terminal 131D are configured on a surface of the first drive circuit 131. Meanwhile, the voltage signal receiving terminal 131A is electrically connected to the first input electrode 1311D, the scanning signal receiving terminal 131B is electrically connected to the second control electrode 1312G, the data signal receiving terminal 131C is electrically connected to the second input electrode 1312D, and the anode connection terminal 131D is electrically connected to the first output electrode 1311S. Correspondingly, to ensure the normal operation of the first drive circuit 131, the display panel 10 further includes the voltage signal output terminal 14, the scanning signal output terminal 15 and the data signal output terminal 16 configured in the first display region AA and disposed on one side of the substrate 11; the voltage signal output terminal 14 transmits a voltage signal transmitted by the voltage signal line to the voltage signal receiving terminal 131A, the scanning signal output terminal 15 transmits a scanning signal transmitted by the scanning signal line to the scanning signal receiving terminal 131B, the data signal output terminal 16 transmits a data signal transmitted by the data signal line to the data signal receiving terminal 131C, and the anode 1211 is electrically connected to the anode connection terminal 131D, which ensures that the first drive circuit 131 may normally receive various signals and normally drive the first pixel unit 121 to emit light.

Further, as shown in FIG. 7, the voltage signal receiving terminal 131A, the scanning signal receiving terminal 131B, and the data signal receiving terminal 131C are disposed in the same layer and disposed on one side of the first drive circuit 131, the anode connection terminal 131D is disposed on another side of the first drive circuit 131, and the voltage signal output terminal 14, the scanning signal output terminal 15, and the data signal output terminal 16 are disposed in the same layer and are located disposed on one side of the first drive circuit 131 facing away from the anode 1211. The first drive circuit 131 is disposed between the anode 1211 and the voltage signal output terminal 14, which ensures that the voltage signal receiving terminal 131A is aligned with the voltage signal output terminal 14 in an orientation facing the voltage signal output terminal 14, the scanning signal receiving terminal 131B is aligned with the scanning signal output terminal 15 in an orientation facing the scanning signal output terminal 15, the data signal receiving terminal 131C is aligned with the data signal output terminal 16 in an orientation facing the data signal output terminal 16, and the anode connection terminal 131D is connected with the anode 1211 in an orientation facing away from the base substrate 11, which ensures that the alignment relationship between the first drive circuit 131 and the display panel 10 is simple, and ensures that structures of the display panel 10 and the first drive circuit 131 are simple.

Optionally, the first drive circuit may include the first drive transistor and one first additional transistor; the first drive transistor includes the monocrystalline silicon transistor and the first additional transistor includes the polycrystalline silicon transistor. Preparing the first drive circuit in the first display region may include:

preparing multiple first drive transistors on a monocrystalline silicon wafer and obtaining the first sub-drive circuit encapsulation structure; the first drive transistor including the first input electrode, the first output electrode, the first control electrode, the voltage signal receiving terminal, and the control signal receiving terminal and the anode connection terminal; the voltage signal receiving terminal being electrically connected to the first output electrode, the control signal receiving terminal being electrically connected to the first control electrode, and the anode connection terminal being electrically connected to the first output electrode; preparing the voltage signal line, the scanning signal line, the data signal line, and the anode on the base substrate, and preparing the first additional transistor, the voltage signal output terminal and the control signal output terminal in an area on the base substrate corresponding to the first display region; the first additional transistor including the second input electrode, the second output electrode, and the second control electrode; the voltage signal output terminal being electrically connected to the voltage signal line, the control signal output terminal being electrically connected to the second output electrode, the scanning signal line being electrically connected to the second control electrode, and the data signal line being electrically connected to the second input electrode.

The first drive circuit encapsulation structure is transferred to the first display region on the base substrate, so that the voltage signal output terminal is electrically connected to the voltage signal receiving terminal, the control signal output terminal is electrically connected to the control signal receiving terminal, and the anode is electrically connected to the anode connection terminal.

Exemplarily, referring to FIGS. 2, 8 and 9, the first drive transistor 1311 is the monocrystalline silicon transistor, and the first additional transistor 1312 is the polycrystalline silicon transistor. The first drive transistor 1311 may be transferred to a side of the base substrate 11 after being prepared on the monocrystalline silicon, the first additional transistor 1312 may be directly prepared and disposed on one side of the base substrate 11. Further, to ensure that the first drive transistor 1311 normally receives signals, a surface of the first drive transistor 1311 may be provided with the voltage signal receiving terminal 131A, the control signal receiving terminal 131E, and the anode connection terminal 131D, wherein the voltage signal receiving terminal 131A is electrically connected to the first input electrode 1311D, the control signal receiving terminal 131E is electrically connected to the first control electrode 1311G (not shown in the figure), and the anode connection terminal 131D is electrically connected to the first output electrode 1311S. Correspondingly, to ensure the normal operation of the first driving circuit 131, the display panel 10 further includes the voltage signal line (not shown in the figure), the scanning signal line (not shown in the figure), the data signal line (not shown in the figure), and the anode 1211 configured in the first display region AA and disposed on one side of the base substrate 11, and the voltage signal output terminal 14 and the control signal output terminal 17 located in the first display region AA, wherein the voltage signal output terminal 14 is electrically connected to the voltage signal line and the voltage signal receiving terminal 131A separately, the control signal output terminal 17 is electrically connected to the second output electrode 1312S and the control signal receiving terminal 131E, the scanning signal line is electrically connected to the second control electrode 1312G, the data signal line is electrically connected to the second input electrode 1312D, and the anode 1211 is electrically connected to the anode connection terminal 131D, which ensures that the first drive circuit 131 may normally drive the first pixel unit 121 to emit light and display.

Further, as shown in FIG. 9, the voltage signal receiving terminal 131A and the control signal receiving terminal 131E are disposed in the same layer and disposed on one side of the first drive transistor 1311, the anode connection terminal 131D is disposed on another side of the first drive transistor 1311, and the voltage signal output terminal 14 and the control signal output terminal 17 are disposed in the same layer and located disposed on one side of the first drive transistor 1311 facing away from the anode 1211. The first drive transistor 1311 is disposed between the anode 1211 and the voltage signal output terminal 14 to ensure that the voltage signal receiving terminal 131A is aligned with the voltage signal output terminal 14 in an orientation facing the voltage signal output terminal 14, the control signal receiving terminal 131E is aligned with the control signal output terminal 17 in an orientation facing the control signal output terminal 17, and the anode is connected to the anode 1211 in an orientation facing away from the base substrate 11 to ensure that the alignment relationship between the first drive circuit 131 and the display panel 10 is simple, and that the structures of the first drive circuit 131 and the display panel 10 are simple.

Optionally, the first drive transistor and the first additional transistor include the monocrystalline silicon transistor; and preparing the first drive circuit in the first display region includes:

preparing a monocrystalline silicon active layer in the first display region; and preparing the first input electrode, the first output electrode, the first control electrode of the first drive transistor, the second input electrode, the second output electrode and the second control electrode of the first additional transistor on the monocrystalline silicon active layer.

Referring to FIGS. 10 and 11, the monocrystalline silicon active layer 1311A1 is prepared in the first display region AA, and then the first input electrode, the first output electrode, the first control electrode, the second input electrode, the second output electrode, and the second control electrode (not shown in the figure) of the first additional transistor are prepared on the monocrystalline silicon active layer 1311A1, so that the first drive circuit with a complete structure is prepared and obtained.

Figure 15:
FIGS. 15 to 19 are a structure diagram of a monocrystalline silicon active layer provided by an embodiment of the present disclosure.
Figure 16:
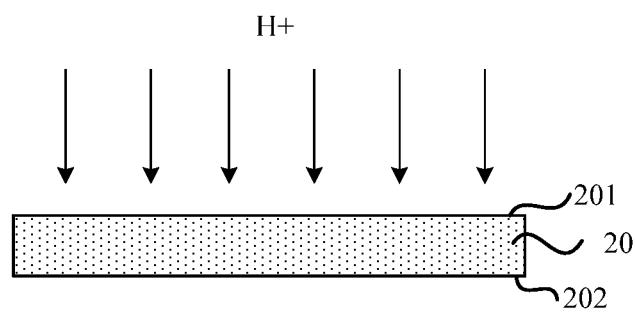
Figure 17:
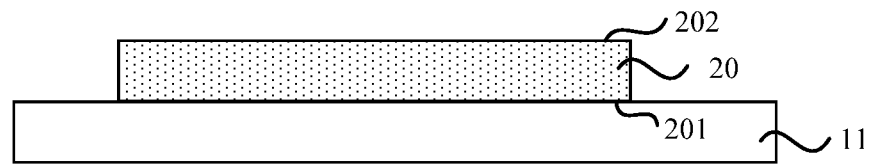
Figure 18:
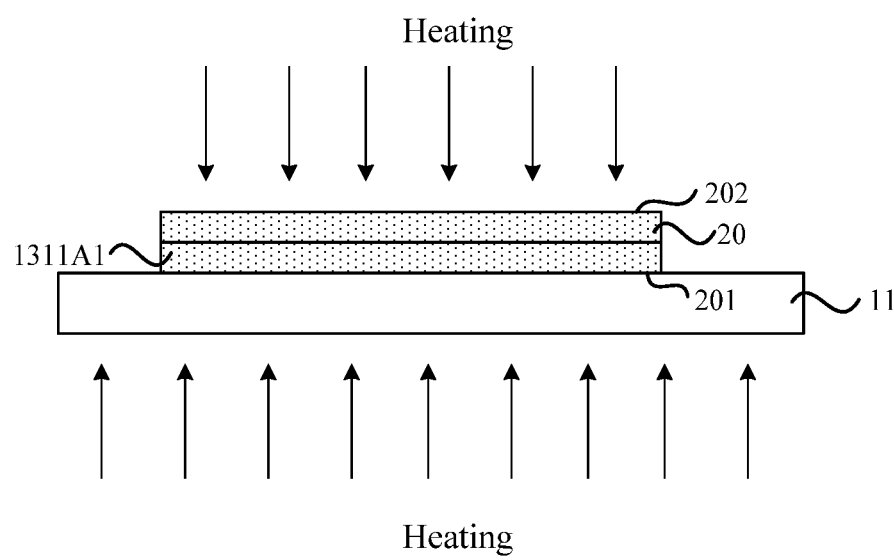
Figure 19:
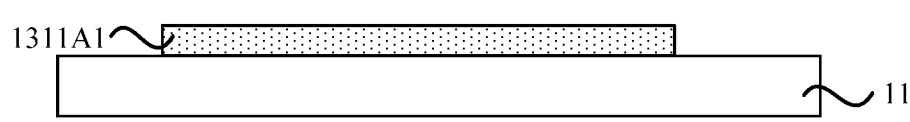

Specifically, FIGS. 15 to 19 are structural diagrams of preparing the monocrystalline silicon active layer according to an embodiment of the present disclosure. As shown in FIGS. 15 to 19, preparing the monocrystalline silicon active layer in the first display region includes: providing the monocrystalline silicon wafer 20 as shown in FIG. 15;

performing hydrogen ion implantation on a first wafer surface of the monocrystalline silicon wafer 20 as shown in FIG. 16;

attaching the monocrystalline silicon wafer 20 to the base substrate 11 in a manner in which the first wafer surface 201 faces the base substrate 11 as shown in FIG. 17;

heat-treating a second wafer surface 202 of the monocrystalline silicon wafer 20 and a surface of the base substrate 11 facing away from the monocrystalline silicon wafer 20, and obtaining a monocrystalline silicon active layer 1311A1 on the base substrate 11, the second wafer surface 202 being opposite to the first wafer surface 201 as shown in FIG. 18; and removing the monocrystalline silicon wafer excluding the monocrystalline silicon active layer 1311A1 on the base substrate 11 and obtaining the monocrystalline silicon active layer 1311A1 located on the base substrate 11 as shown in FIG. 19.

Figure 20:
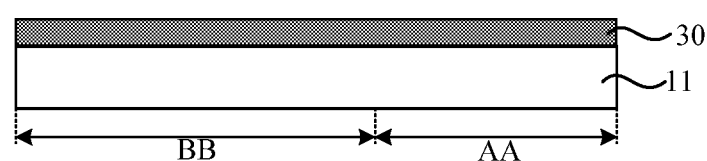
FIGS. 20 to 21 are a structure diagram of a polycrystalline silicon active layer provided by an embodiment of the present disclosure.
Figure 21:
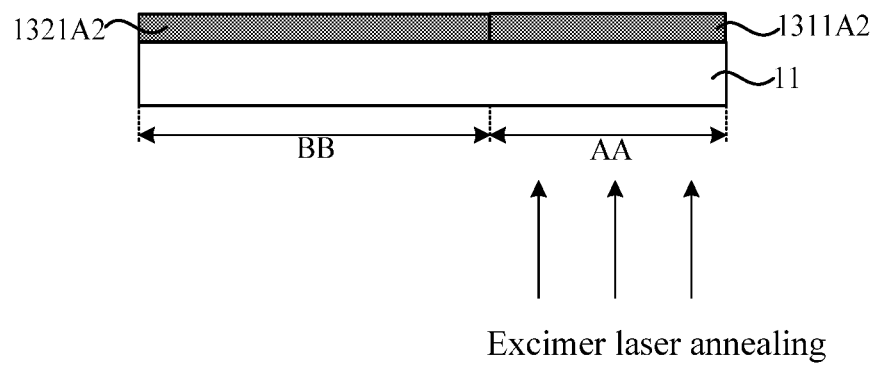

Optionally, FIGS. 20 and 21 are structural diagrams of preparing a polycrystalline silicon active layer according to an embodiment of the present disclosure. As shown in FIGS. 20 and 21, preparing the first drive circuit in the first display region, and preparing the second display region in the second display region includes:

preparing a polycrystalline silicon layer 30 disposed on one side of the base substrate 11 as shown in FIG. 20; and performing excimer laser annealing on the polycrystalline silicon layer in the first display region AA, and obtaining a first polycrystalline silicon active layer 1311A2 in the first display region AA and a second polycrystalline silicon active layer 1321A2 in the second display BB region, wherein a grain size of the first polycrystalline silicon active layer 1311A2 is larger than a grain size of the second polycrystalline silicon active layer 1321A2, as shown in FIG. 21.

In summary, for the specific structure of the first drive circuit, the embodiments of the present disclosure provide a variety of different manufacturing methods for the first drive circuit. In the actual preparation process, different preparation processes need to be selected according to actual needs.

Figure 22:
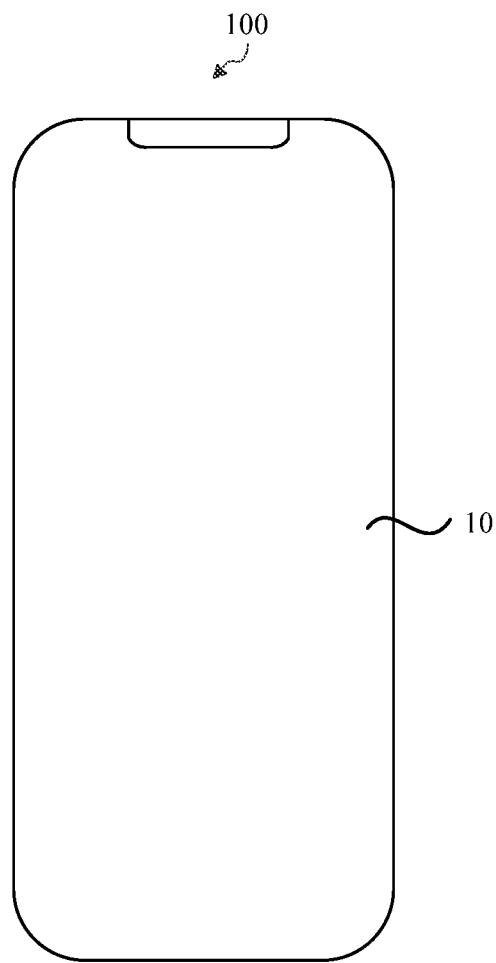
FIG. 22 is a structural diagram of a display device provided by an embodiment of the present disclosure.

Based on the same inventive concept, the embodiment of the present disclosure further provides a display device, including: the display panel described above in any embodiment of the present disclosure. Specifically, FIG. 22 is a structural diagram of a display device according to an embodiment of the present disclosure. Referring to FIG. 22, a display device 100 includes a display panel 10 according to the embodiment described above. Exemplarily, the display device 100 may be a mobile phone, a computer, a smart wearable device (such as a smart watch), an onboard display device, or another electronic device and no limitations are made thereto in embodiments of the present disclosure.

It is to be noted that the above are merely preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with each other, and may be collaborated with each other and technically driven in various ways. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include additional equivalent embodiments without departing from the concept of the present disclosure. The scope of the present disclosure is determined by the scope of the appended claims.

What is claimed is:

1. A display panel, comprising a base substrate, drive circuits and pixel units disposed on one side of the base substrate, wherein the display panel comprises a first display region and a second display region;

wherein the first display region comprises a plurality of first pixel units, the second display region comprises a plurality of second pixel units, a pixel unit density of the first pixel units is less than a pixel unit density of the second pixel units;

wherein the first display region further comprises a plurality of first drive circuits, and the plurality of first drive circuits are electrically connected to the plurality of first pixel units;

wherein the second display region further comprises a plurality of second drive circuits, and the plurality of second drive circuits are electrically connected to the plurality of second pixel units;

wherein a first drive circuit of the plurality of first drive circuits comprises a first drive transistor and at least one first additional transistor, a second drive circuit of the plurality of second drive circuits comprises a second drive transistor and a second additional transistor, a number of first additional transistors in the first drive circuit is less than a number of second additional transistors in the second drive circuit, and an area of the orthographic projection of a channel area of the first drive transistor on the base substrate is less than an area of the orthographic projection of a channel area of the second drive transistor on the base substrate.

2. The display panel of claim 1, wherein the first drive circuit comprises the first drive transistor and a first additional transistor, the first drive transistor and the first additional transistor comprise monocrystalline silicon transistors;

wherein the first drive transistor comprises a first input electrode, a first output electrode and a first control electrode, the first additional transistor comprises a second input electrode, a second output electrode and a second control electrode, and wherein the second output electrode is electrically connected to the first control electrode;

wherein the first drive circuit further comprises a voltage signal receiving terminal, a scanning signal receiving terminal, a data signal receiving terminal and an anode connection terminal, the voltage signal receiving terminal is electrically connected to the first input electrode, the scanning signal receiving terminal is electrically connected to the second control electrode, the data signal receiving terminal is electrically connected to the second input electrode and the anode connection terminal is electrically connected to the first output electrode;

wherein the display panel further comprises an anode, a data signal line, a scanning signal line and a voltage signal line disposed on one side of the base substrate, a data signal output terminal, a scanning signal output terminal and a voltage signal output terminal located in the first display region and disposed on one side of the base substrate; and the voltage signal output terminal is electrically connected to the voltage signal line and the voltage signal receiving terminal separately, the scanning signal output terminal is electrically connected to the scanning signal line and the scanning signal receiving terminal separately, the data signal output terminal is electrically connected to the data signal line and the data signal receiving terminal separately, and the anode is electrically connected to the anode connection terminal.

3. The display panel of claim 2, wherein the voltage signal output terminal, the scanning signal output terminal, and the data signal output terminal are disposed in a same layer and disposed on one side of the first drive circuit facing away from the anode; and wherein the first drive circuit is disposed between the anode and a plane on which the voltage signal output terminal is located.

4. The display panel of claim 1, wherein the first drive circuit comprises the first drive transistor and a first additional transistor, the first drive transistor comprises a monocrystalline silicon transistor, and the first additional transistor comprises a polycrystalline silicon transistor;

wherein the first drive transistor comprises a first input electrode, a first output electrode, a first control electrode, a voltage signal receiving terminal, a control signal receiving terminal, and an anode connection terminal, wherein the voltage signal receiving terminal is electrically connected to the first input electrode, the control signal receiving terminal is electrically connected to the first control electrode, and the anode connection terminal is electrically connected to the first output electrode;

wherein the display panel further comprises a voltage signal line, a scanning signal line, a data signal line, and an anode disposed on one side of the base substrate, and the first additional transistor, a voltage signal output terminal and a control signal output terminal located disposed on one side of the base substrate and located in the first display region;

wherein the first additional transistor comprises a second input electrode, a second output electrode, and a second control electrode; and wherein the voltage signal output terminal is electrically connected to the voltage signal line and the voltage signal receiving terminal separately, the control signal output terminal is electrically connected to the second output electrode and the control signal receiving terminal separately, the scanning signal line is electrically connected to the second control electrode, the data signal line is electrically connected to the second input electrode, and the anode is electrically connected to the anode connection terminal.

5. The display panel of claim 4, wherein the voltage signal output terminal and the control signal output terminal are disposed on a same layer and disposed on one side of the first drive transistor facing away from the anode; and wherein the first drive transistor is disposed between the anode and a plane on which the voltage signal output terminal is located.

6. The display panel of claim 1, wherein the first drive transistor and the first additional transistor comprise a monocrystalline silicon active layer, the second drive transistor and the second additional transistor comprise a polycrystalline silicon active layer; and the monocrystalline silicon active layer and the polycrystalline silicon active layer are configured in different layers.

7. The display panel of claim 6, wherein the monocrystalline silicon active layer is disposed on one side of the polycrystalline silicon active layer facing away from the base substrate; or wherein the monocrystalline silicon active layer is disposed on one side of the polycrystalline silicon active layer facing towards the base substrate;

wherein the display panel further comprises a light-blocking layer, wherein the light-blocking layer is disposed between the monocrystalline silicon active layer and the base substrate, and a vertical projection of the light-blocking layer on a plane on which the base substrate is located is at least partially overlapped with a vertical projection of the monocrystalline silicon active layer on the plane on which the base substrate is located.

8. The display panel of claim 1, wherein each of the first drive transistor and the at least one first additional transistor comprises a polycrystalline silicon transistor, each of the second drive transistor and the second additional transistor comprises the polycrystalline silicon transistor;

wherein the each of the first drive transistor and the at least one first additional transistor comprises a first polycrystalline silicon active layer, the each of the second drive transistor and the second additional transistor comprises a second polycrystalline silicon active layer, and a grain size of the first polycrystalline silicon active layer is larger than a grain size of the second polycrystalline silicon active layer; and wherein the first polycrystalline silicon active layer and the second polycrystalline silicon active layer are disposed in a same layer.

9. The display panel of claim 8, wherein the grain size of the first polycrystalline silicon active layer is D1, and the grain size of the second polycrystalline silicon active layer is D2, wherein 50 micron (μm)≤D1≤5 millimeter (mm) and 10 nanometer (nm)≤D2≤10 μm.

10. The display panel of claim 8, wherein an electron mobility of the first polycrystalline silicon active layer is V, wherein V≥500 cm$^2$/(volt·second).

11. The display panel of claim 1, wherein the first display region further comprises a first signal line connected to the first drive circuit, and the second display region further comprises a second signal line connected to the second drive circuit, wherein a line width of the first signal line is d1, and a line width of the second signal line is d2, wherein 500 nm≤d1≤2 μm and d2≥2 μm.

12. The display panel of claim 1, wherein the display panel further comprises a transition display region between the first display region and the second display region;

wherein the transition display region comprises a plurality of third pixel units and a third drive circuit, and a pixel unit density of the third pixel units is greater than the pixel unit density of the first pixel units and is less than the pixel unit density of the second pixel units; and wherein the third drive circuit comprises a third drive transistor and at least one third additional transistor, a number of third additional transistors in the third drive circuit is greater than the number of first additional transistors in the first drive circuit and is less than the number of second additional transistors in the second drive circuit; and wherein an area of the orthographic projection of a channel area of the third drive transistor on the base substrate is larger than the area of the orthographic projection of the channel area of the first drive transistor on the base substrate, and is smaller than the area of the orthographic projection of the channel area of the second drive transistor on the base substrate.

13. The display panel of claim 1, wherein a width of the channel area of the first drive transistor is W1 in a direction perpendicular to an extension direction of an active layer of the first drive transistor, a width of the channel area of the second drive transistor is W2 in a direction perpendicular to an extension direction of an active layer of the second drive transistor; and wherein a length of the channel area of the first drive transistor is L1, a length of the channel area of the second drive transistor is L2, wherein $$\frac{1}{60} < \frac{W1 \cdot L1}{W2 \cdot L2} < \frac{1}{2}.$$

14. A manufacturing method for a display panel, wherein the display panel comprises a first display region and a second display region;

wherein the manufacturing method comprises:
providing a base substrate, and preparing pixel units and drive circuits disposed on one side of the base substrate;
preparing first drive circuits in the first display region, and preparing second drive circuits in the second display region, one of the first drive circuits comprises a first drive transistor and at least one first additional transistor, one of the second drive circuits comprises a second drive transistor and at least one second additional transistor, a number of first additional transistors in the first drive circuit is less than a number of second additional transistors in the second drive circuit, an area of the orthographic projection of a channel area of the first drive transistor on the base substrate is smaller than an area of the orthographic projection of a channel area of the second drive transistor on the base substrate; and
preparing a plurality of first pixel units in the first display region, preparing a plurality of second pixel units in the second display region, the plurality of first pixel units are electrically connected to the first drive circuits, and the plurality of second pixel units are electrically connected to the second drive circuits, and a pixel unit density of the plurality of first pixel units is less than a pixel unit density of the plurality of second pixel units.

15. The manufacturing method of claim 14, wherein one of the first drive circuits comprises the first drive transistor and one first additional transistor, the first drive transistor and the first additional transistor comprise monocrystalline silicon transistors;
wherein the preparing the first drive circuits in the first display region comprises:
preparing a plurality of the first drive circuits on a monocrystalline silicon wafer and obtaining a first drive circuit encapsulation structure, one of the first drive circuits comprises the first drive transistor, one first additional transistor, a voltage signal receiving terminal, a scanning signal receiving terminal, a data signal receiving terminal and an anode connection terminal; the first drive transistor comprises a first input electrode, a first output electrode, and a first control electrode, and the first additional transistor comprises a second input electrode, a second output electrode, and a second control electrode; wherein the second output electrode is electrically connected to the first control electrode, the voltage signal receiving terminal is electrically connected to the first input electrode, the scanning signal receiving terminal is electrically connected to the second control electrode, the data signal receiving terminal is electrically connected to the second input electrode, and the anode connection terminal is electrically connected to the first output electrode;
preparing a voltage signal line, a scanning signal line, a data signal line, and an anode on the base substrate, and preparing a voltage signal output terminal, a scanning signal output terminal, and a data signal output terminal in an area on the base substrate corresponding to the first display region; the voltage signal output terminal is electrically connected to the voltage signal line, the scanning signal output terminal is electrically connected to the scanning signal line, and the data signal output terminal is electrically connected to the data signal line; and
transferring the first drive circuit encapsulation structure to the first display region on the base substrate, so that the voltage signal output terminal is electrically connected to the voltage signal receiving terminal, and the scanning signal output terminal is electrically connected to the scanning signal receiving terminal, the data signal output terminal is electrically connected to the data signal receiving terminal, and the anode is electrically connected to the anode connection terminal.

16. The manufacturing method of claim 14, wherein the first drive circuits comprise the first drive transistor and a first additional transistor, wherein the first drive transistor comprises a monocrystalline silicon transistor, and the first additional transistor comprises a polycrystalline silicon transistor;
wherein the preparing the first drive circuits in the first display region comprises:
preparing a plurality of first drive transistors on a monocrystalline silicon wafer to obtain a first sub-drive circuit encapsulation structure, wherein the first drive transistor comprises a first input electrode, a first output electrode, a first control electrode, a voltage signal receiving terminal, a control signal receiving terminal and an anode connection terminal, wherein the voltage signal receiving terminal is electrically connected to the first input electrode, the control signal receiving terminal is electrically connected to the first control electrode, and the anode connection terminal is electrically connected to the first output electrode;
preparing a voltage signal line, a scanning signal line, a data signal line, and an anode on the base substrate, and preparing a first additional transistor, a voltage signal output terminal and a control signal output terminal in an area on the base substrate corresponding to the first display region, wherein the first additional transistor comprises a second input electrode, a second output electrode and a second control electrode, wherein the voltage signal output terminal is electrically connected to the voltage signal line, the control signal output terminal is electrically connected to the second output electrode, the scanning signal line is electrically connected to the second control electrode, and the data signal line is electrically connected to the second input electrode;
transferring the first sub-drive circuit encapsulation structure to the first display region on the base substrate, so that the voltage signal output terminal is electrically connected to the voltage signal receiving terminal, and the control signal output terminal is electrically connected to the control signal receiving terminal, and the anode is electrically connected to the anode connection terminal.

17. The manufacturing method of claim 14, wherein the first drive transistor and the first additional transistor comprise monocrystalline silicon transistors;
wherein the preparing the first drive circuits in the first display region comprises:
preparing a monocrystalline silicon active layer in the first display region; and
preparing a first input electrode, a first output electrode, and a first control electrode of the first drive transistor, a second input electrode, a second output electrode and a second control electrode of the first additional transistor on the monocrystalline silicon active layer.

18. The manufacturing method of claim 17, wherein the preparing the monocrystalline silicon active layer in the first display region comprises:
providing a monocrystalline silicon wafer;

performing hydrogen ion implantation on a first wafer surface of the monocrystalline silicon wafer;

attaching the monocrystalline silicon wafer to the base substrate in a manner in which the first wafer surface faces towards the base substrate;

heating a second wafer surface of the monocrystalline silicon wafer and a surface of the base substrate facing away from the monocrystalline silicon wafer, obtaining a monocrystalline silicon active layer on the base substrate, wherein the second wafer surface is opposite to the first wafer surface; and removing the monocrystalline silicon wafer excluding the monocrystalline silicon active layer on the base substrate and obtaining the monocrystalline silicon active layer disposed on the base substrate.

19. The manufacturing method of claim 14, wherein each of the first drive transistor and the first additional transistor comprises a polycrystalline silicon transistor, each of the second drive transistor and the second additional transistor comprises the polycrystalline silicon transistor; and wherein the preparing the first drive circuits in the first display region and preparing the second drive circuits in the second display region comprises:

preparing a polycrystalline silicon layer disposed on one side of the base substrate;

performing excimer laser annealing on the polycrystalline silicon layer in the first display region, obtaining a first polycrystalline silicon active layer in the first display region and a second polycrystalline silicon active layer in the second display region, wherein a grain size of the first polycrystalline silicon active layer is larger than a grain size of the second polycrystalline silicon active layer.

20. A display device, comprising a display panel, wherein the display panel comprises: a base substrate, drive circuits and pixel units disposed on one side of the base substrate, wherein the display panel comprises a first display region and a second display region;

wherein the first display region comprises a plurality of first pixel units, the second display region comprises a plurality of second pixel units, a pixel unit density of the first pixel units is less than a pixel unit density of the second pixel units;

wherein the first display region further comprises a plurality of first drive circuits, and the plurality of first drive circuits are electrically connected to the plurality of first pixel units;

wherein the second display region further comprises a plurality of second drive circuits, and the plurality of second drive circuits are electrically connected to the plurality of second pixel units;

wherein one first drive circuit of the plurality of first drive circuits comprises a first drive transistor and at least one first additional transistor, one second drive circuit of the plurality of second drive circuits comprises a second drive transistor and a second additional transistor, a number of first additional transistors in the first drive circuit is less than a number of second additional transistors in the second drive circuit, and an area of the orthographic projection of a channel area of the first drive transistor on the base substrate is less than an area of the orthographic projection of a channel area of the second drive transistor on the base substrate; and wherein the display device further comprises a sensor, and wherein the first display region is reused as a sensor reserved area.

* * * * *